(12) United States Patent
Liu et al.

(10) Patent No.: US 9,093,382 B2
(45) Date of Patent: *Jul. 28, 2015

(54) INFRARED OLED DISPLAY DEVICE AND THE MANUFACTURING METHOD THEREOF

(71) Applicant: Shenzhen China Star Optoelectronics Technology Co., Ltd., Shenzhen, Guangdong (CN)

(72) Inventors: Yawei Liu, Shenzhen (CN); Yuan-Chun Wu, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 110 days.

This patent is subject to a terminal disclaimer.

(21) Appl. No.: 13/979,880

(22) PCT Filed: Jun. 24, 2013

(86) PCT No.: PCT/CN2013/077747
§ 371 (c)(1),
(2) Date: Jul. 16, 2013

(87) PCT Pub. No.: WO2014/172982
PCT Pub. Date: Oct. 30, 2014

(65) Prior Publication Data
US 2015/0034911 A1 Feb. 5, 2015

(51) Int. Cl.
*H01L 27/28* (2006.01)
*H01L 31/053* (2014.01)
(Continued)

(52) U.S. Cl.
CPC .......... *H01L 27/288* (2013.01); *H01L 27/3225* (2013.01); *H01L 27/3227* (2013.01); *H01L 31/02008* (2013.01); *H01L 31/0392* (2013.01); *H01L 31/053* (2014.12);
(Continued)

(58) Field of Classification Search
CPC ............ H01L 27/142; H01L 27/14649; H01L 27/288; H01L 27/3225; H01L 27/3227; H01L 31/02008; H01L 31/053; H01L 33/44
See application file for complete search history.

(56) References Cited

U.S. PATENT DOCUMENTS 7,078,726 B2 * 7/2006 Pichler et al. .................... 257/40
2001/0030325 A1 * 10/2001 Epstein et al. .................. 257/79
(Continued)

FOREIGN PATENT DOCUMENTS

WO WO 2012171396 A1 * 12/2012

*Primary Examiner* — Joseph C Nicely
(74) *Attorney, Agent, or Firm* — Andrew C. Cheng

(57) ABSTRACT

The present invention provides an infrared OLED display device and the manufacturing method thereof. Wherein, the infrared OLED display device comprises multiple infrared OLED units, which are used to display infrared image; a solar cell, which is used to absorb sunlight and then convert it to electrical energy; a transformer, which is used to transform the voltage of the electrical energy generated from the solar cell to the voltage of power for the infrared OLED units; and a rechargeable battery, which is used to store the electrical energy after the transformer converts the voltage and to provide the power for the infrared OLED units; wherein, the solar cell is connected with the transformer, the transformer is connected with the rechargeable battery, and the rechargeable battery is connected with the multiple infrared OLED units. The solar cell and the infrared OLED unit are integrated into one device, so that the infrared OLED display device not only display infrared image, but also charge itself using the solar cell, which saves energy.

19 Claims, 3 Drawing Sheets

(51) Int. Cl.
  *H01L 31/02* (2006.01)
  *H01L 27/32* (2006.01)
  *H01L 31/0392* (2006.01)
  *H01L 51/52* (2006.01)
  *H01L 51/56* (2006.01)
  *H01L 51/42* (2006.01)

(52) U.S. Cl.
  CPC ........... *H01L 51/5256* (2013.01); *H01L 51/56* (2013.01); *H01L 51/4253* (2013.01); *H01L 2227/323* (2013.01)

(56) References Cited

U.S. PATENT DOCUMENTS

| | | | |
|---|---|---|---|
| 2004/0031977 A1* | 2/2004 | Brown et al. | 257/222 |
| 2004/0119401 A1* | 6/2004 | Lee et al. | 313/504 |
| 2005/0260777 A1* | 11/2005 | Brabec et al. | 438/20 |
| 2008/0192353 A1* | 8/2008 | Nagahama et al. | 359/599 |
| 2009/0219273 A1* | 9/2009 | Nathan et al. | 345/211 |
| 2010/0117521 A1* | 5/2010 | Yersin et al. | 313/504 |
| 2011/0006905 A1* | 1/2011 | Masuda | 340/636.1 |
| 2011/0108856 A1* | 5/2011 | Wu et al. | 257/80 |
| 2011/0259412 A1* | 10/2011 | Kim et al. | 136/256 |
| 2012/0061652 A1* | 3/2012 | Sugisawa et al. | 257/40 |
| 2012/0091923 A1* | 4/2012 | Kastner-Jung et al. | 315/360 |
| 2012/0146492 A1* | 6/2012 | Ryu et al. | 313/512 |
| 2012/0168737 A1* | 7/2012 | Tomono et al. | 257/40 |
| 2012/0313898 A1* | 12/2012 | Chang et al. | 345/175 |
| 2013/0087200 A1* | 4/2013 | Xue et al. | 136/259 |
| 2013/0276886 A1* | 10/2013 | Worfolk et al. | 136/263 |
| 2013/0280847 A1* | 10/2013 | Lewis et al. | 438/64 |
| 2014/0009453 A1* | 1/2014 | Liu et al. | 345/211 |
| 2014/0070171 A1* | 3/2014 | Liu et al. | 257/40 |
| 2014/0159042 A1* | 6/2014 | Hutchings et al. | 257/52 |
| 2014/0183529 A1* | 7/2014 | Yamazaki et al. | 257/43 |
| 2014/0225090 A1* | 8/2014 | Lee et al. | 257/40 |
| 2014/0272290 A1* | 9/2014 | Jewhurst et al. | 428/141 |
| 2015/0004452 A1* | 1/2015 | Dilleen | 429/94 |
| 2015/0005497 A1* | 1/2015 | Murer et al. | 544/225 |
| 2015/0028344 A1* | 1/2015 | Kimura | 257/72 |

\* cited by examiner

INFRARED OLED DISPLAY DEVICE AND THE MANUFACTURING METHOD THEREOF

This application claims priority to Chinese Patent Application Serial No. 201310147212.8, named as "Infrared OLED display device and the manufacturing method thereof", filed on Apr. 25, 2013, the specification of which is incorporated herein by reference.

BACKGROUND OF THE INVENTION

1. Field of the Invention

The present invention relates to the field of image display, and in particular to an infrared OLED display device and the manufacturing method thereof.

2. The Related Arts

The infrared band in the range of 0.78~1000 μm is an important electromagnetic spectrum used in the field of military and civilian. Infrared is commonly used in heating, physiotherapy, night vision, communication, navigation, plant cultivation, livestock rearing, high temperature sterilization, infrared night vision, monitoring equipment, mobile infrared port, the hotel door cards, car, TV remote control, infrared sensor of sink, hotel front door sensors, etc. Furthermore, the wavelength windows of optical fiber communication (850, 1330, 1550 nm) are located infrared spectrum. Infrared band also relates to data processing, storage, security tagging, infrared detectors, and infrared guidance applications. The organic electroluminescent device has several characteristics of wide range of material selection, low driving voltage, fast response speed, wide light viewing angle, light weight, thin, flexible, large area, and large-scale production. Therefore, the research and the development of infrared OLED has important scientific significance and broad application prospects.

Because infrared OLED has the characteristics of self-luminous, it will emit light when a current s passed. There are a variety of options to supply the power. Solar cell is not only primary energy, but also renewable energy. It is rich in resources, free to use, no need transportation, and no pollution to the environment. It creates a new lifestyle for mankind, which allows the community and humanity into an era of energy conservation and pollution reduction. The utilization of solar energy includes photothermal, photovoltaic, photochemical and other means, wherein, solar power is the most directly utilizing way. Photovoltaic (PV) is a device directly converting solar radiation into electrical energy. Sunlight illuminates on the p-n junction of the semiconductor, forming a new hole-electron pairs. In the electric field of the p-n junction, photogenerated holes flow from the n region to the p region, and photogenerated electrons flow from the p region n region, which forms the current after closing the circuit.

Unfortunately, the industry has not yet integrated the solar cell and the infrared OLED device into a device, which is the objective of the present invention.

SUMMARY OF THE INVENTION

The technical issue to be solved by the present invention is to provide an infrared OLED display device and the manufacturing method thereof, which can display infrared image and charge itself using solar energy.

In order to solve the technical issue, the present invention provides an infrared OLED display device, comprising: multiple infrared OLED units, which are used to display infrared image; a solar cell, which is used to absorb sunlight and then convert it to electrical energy; a transformer, which is used to transform the voltage of the electrical energy generated from the solar cell to the voltage of power for the infrared OLED units; and a rechargeable battery, which is used to store the electrical energy after the transformer converts the voltage and to provide the power for the infrared OLED units; wherein, the solar cell is connected with the transformer, the transformer is connected with the rechargeable battery, and the rechargeable battery is connected with the multiple infrared OLED units.

Wherein, the infrared OLED unit from top to bottom in sequence consists of: an inorganic protective layer, a cathode, an electron transporting layer, a hole blocking layer, an infrared light-emitting layer, a hole transporting layer, an anode, an isolating protective layer, and a flexible substrate.

Wherein, the inorganic protective layer is covered on the cathode, the electron transporting layer, the hole blocking layer, the infrared light-emitting layer, the hole transporting layer, and the anode, which is connected with the isolating protective layer.

Wherein, the isolating protective layer is an alternating structure with an inorganic dielectric dense layer and a polymer layer.

Wherein, the inorganic dielectric dense layer is selected from the materials consisting of transparent oxide film, transparent fluoride film, $Si_xN_y$, chalcogenide glass, ZnS, $SiO_xN_y$, or $SiO_xC_y$.

Wherein, the transparent oxide film consists of $TiO_2$, MgO, $SiO_2$, $ZrO_2$, ZnO, or $Al_2O_3$; the transparent fluoride film consists of LiF or $MgF_2$; the $Si_xN_y$ consists of $Si_3N_4$, TiN, or $SiN_x$; the chalcogenide glass consists of Se, Te, or Sb.

Wherein, the polymer layer is selected from the materials consisting of parylene-based material, polyolefin-based material, polyester-based material, or polyimide.

Wherein, the parylene-based material consists of poly-p-xylylene (PPX) or poly-2-chloro-p-xylene (PCPX); the polyolefin-based material consists of polyethylene (PE), polystyrene (PS), polypropylene (PP), poly ethylene terephthalate (PET), polytetrafluoroethene (PTFE), or polyfluoroalkoxy (PFA); the polyester-based material consists of polyethylene naphthalate (PEN), polycarbonate (PC), polyethylene methyl methacrylate (PMMA), polyvinyl acetate (PVAC), or polyethersulfone (PES).

Wherein, the inorganic protective layer is selected from the materials consisting of $TiO_2$, $SiO_2$, $Al_2O_3$, $SiN_x$, $SiO_xN_y$, $SiO_xC_y$, or diamond-like carbon (DLC) film; the material of the cathode is Al or Ag; the material of the electron transporting layer is 8-tris-hydroxyquinoline aluminum (Alq3); the material of the hole blocking layer is 1,3,5-Tris(1-phenyl-1H-benzimidazol-2-yl)benzene (TPBI) or 2,9-Dimethy-4,7-diphenyl-1,10-phenanthroline (BCP); the material of the infrared light-emitting layer is copper phthalocyanine or tris (8-hydroxyquinolinato) erbium; the material of the hole transporting layer is N,N'-bis(3-methylphenyl)-N,N'-Diphenyl-1,1'-biphenyl 4,4'-diamine (TPD) or N,N'-bis(1-naphthyl)-N,N'-diphenyl-1,1'-biphenyl-4,4'-diamine (NPD); and the material of the anode is indium tin oxide (ITO).

Wherein, the flexible substrate is plastic substrate, film substrate, thin glass substrate, or stainless steel foil substrate.

Wherein, the infrared OLED unit from top to bottom in sequence consists of: a cathode, an electron transporting layer, a hole blocking layer, an infrared light-emitting layer, a hole transporting layer, an anode, and a hard screen substrate.

Wherein, the solar cell is organic solar cell or inorganic solar cell; the organic solar cell is polymer with heterogeneous p-n junction structure; wherein the organic heterogeneous p-n junction material is poly(3-hexylthiophene) (P3HT): [6,6]-phenyl C61-butyric acid methyl ester (PCBM) mixture, poly(2-methoxy-5-(2'-ethyl-hexyloxy)-1,4-phenylene vinylene) (MEH-PPV): [6,6]-phenyl C61-butyric acid methyl ester (PCBM) mixture, or poly[2-methoxy-5-(3',7'-Dimethyloctyloxy)-1,4-phenylenevinylene] (MDMO-PPV): [6,6]-phenyl C61-butyric acid methyl ester (PCBM) mixture; the inorganic solar cell is amorphous silicon solar cell, polycrystalline silicon solar cell, or inorganic compound semiconductor thin film solar cells.

The present invention further provides a manufacturing method of infrared OLED display device, comprising: providing a substrate; preparing a solar cell on the substrate; preparing an infrared OLED unit on the substrate; and providing a transformer and a rechargeable battery respectively; wherein, the solar cell is connected with the transformer, the transformer is connected with the rechargeable battery, and the rechargeable battery is connected with the infrared OLED unit.

Wherein, the infrared OLED unit from top to bottom in sequence consists of: an inorganic protective layer, a cathode, an electron transporting layer, a hole blocking layer, an infrared light-emitting layer, a hole transporting layer, an anode, an isolating protective layer, and a flexible substrate; the manufacturing method of the isolating protective layer is: sputtering a polymer material on the substrate, curing by UV irradiation, and then sputtering a layer of inorganic dielectric material, which forms an alternating structure with an inorganic dielectric dense layer and a polymer layer.

Wherein, the polymer material is selected from the materials consisting of parylene-based material, polyolefin-based material, polyester-based material, or polyimide.

Wherein, the parylene-based material consists of poly-p-xylylene (PPX) or poly-2-chloro-p-xylene (PCPX); the polyolefin-based material consists of polyethylene (PE), polystyrene (PS), polypropylene (PP), poly ethylene terephthalate (PET), polytetrafluoroethene (PTFE), or polyfluoroalkoxy (PFA); the polyester-based material consists of polyethylene naphthalate (PEN), polycarbonate (PC), polyethylene methyl methacrylate (PMMA), polyvinyl acetate (PVAC), or polyethersulfone (PES).

Wherein, the solar cell is organic solar cell or inorganic solar cell; wherein the inorganic solar cell is amorphous silicon solar cell, polycrystalline silicon solar cell, or inorganic compound semiconductor thin film solar cells; the inorganic solar cell is prepared prior to the infrared OLED unit on the substrate.

Wherein, the organic solar cell is polymer with heterogeneous p-n junction structure; wherein the organic heterogeneous p-n junction material is poly(3-hexylthiophene) (P3HT): [6,6]-phenyl C61-butyric acid methyl ester (PCBM) mixture, poly(2-methoxy-5-(2'-ethyl-hexyloxy)-1,4-phenylene vinylene) (MEH-PPV): [6,6]-phenyl C61-butyric acid methyl ester (PCBM) mixture, or poly[2-methoxy-5-(3',7'-Dimethyloctyloxy)-1,4-phenylenevinylene] (MDMO-PPV): [6,6]-phenyl C61-butyric acid methyl ester (PCBM) mixture; the step of preparing the organic solar cell on the substrate specifically is: dissolving the organic mixture in an organic solvent such as chlorobenzene, and then spraying on a specific position of the substrate using printing technology.

Wherein, the step of preparing the polycrystalline silicon solar cell on the substrate specifically is: using amorphous silicon production process, proceeding with thermal annealing or laser annealing after coating, and growing polycrystalline silicon from amorphous silicon.

The present invention further provides a infrared OLED display device, comprising: multiple infrared OLED units, which are used to display infrared image, the infrared OLED unit from top to bottom in sequence consisting of: an inorganic protective layer, a cathode, an electron transporting layer, a hole blocking layer, an infrared light-emitting layer, a hole transporting layer, an anode, an isolating protective layer, and a flexible substrate; a solar cell, which is used to absorb sunlight and then convert it to electrical energy; a transformer, which is used to transform the voltage of the electrical energy generated from the solar cell to the voltage of power for the infrared OLED units; and a rechargeable battery, which is used to store the electrical energy after the transformer converts the voltage and to provide the power for the infrared OLED units; wherein, the solar cell is connected with the transformer, the transformer is connected with the rechargeable battery, and the rechargeable battery is connected with the multiple infrared OLED units.

The present invention provides the infrared OLED display device and the manufacturing method thereof. The solar cell and the infrared OLED unit are integrated into one device, so that the infrared OLED display device not only display infrared image, but also charge itself using the solar cell, which saves energy.

BRIEF DESCRIPTION OF THE DRAWINGS

To illustrate clearly the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

The accompanying drawings and the following detailed descriptions are the preferred embodiments of the present invention.

The present invention is to integrate infrared OLED display units and solar cell onto a substrate to form an infrared OLED display device with self-charging function, which allows the infrared OLED to display and to self-charge using solar energy.

Figure 1:
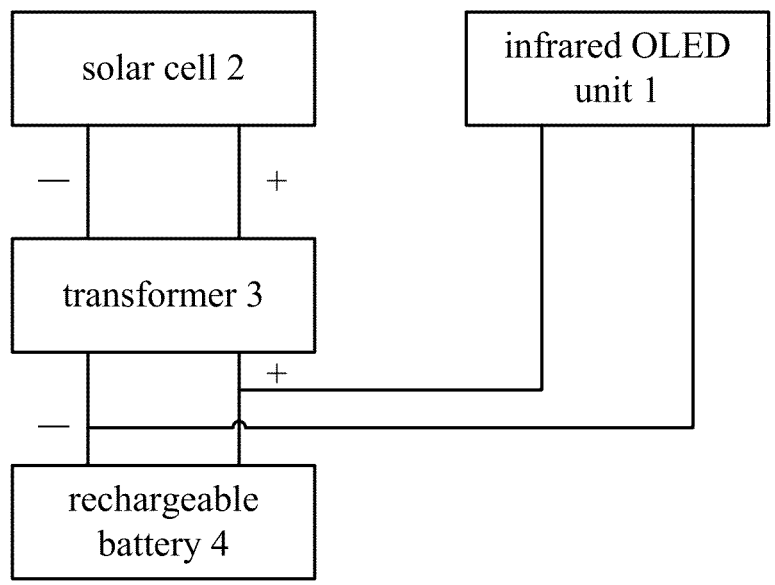
FIG. 1 is a schematic structure of an infrared OLED display device according to the first embodiment of the present invention.

Referring to FIG. 1, it shows a schematic structure of an infrared OLED display device according to the first embodiment of the present invention. The infrared OLED display device according to the present embodiment comprises: multiple infrared OLED units 1, a solar cell 2, a transformer 3, and a rechargeable battery 4. The infrared OLED units 1 are used to display infrared image. The solar cell 2, which is used to absorb sunlight and then convert it to electrical energy, is connected with the transformer 3. The transformer 3, which is used to transform the voltage of the electrical energy generated from the solar cell 2 to the voltage of power for the infrared OLED units 1, is connected with the rechargeable battery 4. The rechargeable battery 4, which is used to store the electrical energy after the transformer 3 converts the voltage and to provide the power for the infrared OLED units 1, is connected with multiple infrared OLED units 1, respectively. When the sun light is insufficient or the solar cell can not provide sufficient power, an external power supply can also be used to provide power for the infrared OLED units 1. It is noted that FIG. 1 is a schematic diagram, so that only one of the infrared OLED units 1 is shown. Actually, each infrared OLED unit 1 is a pixel, which is connected to the rechargeable battery 4 respectively and provides power by the rechargeable battery 4.

Figure 2:
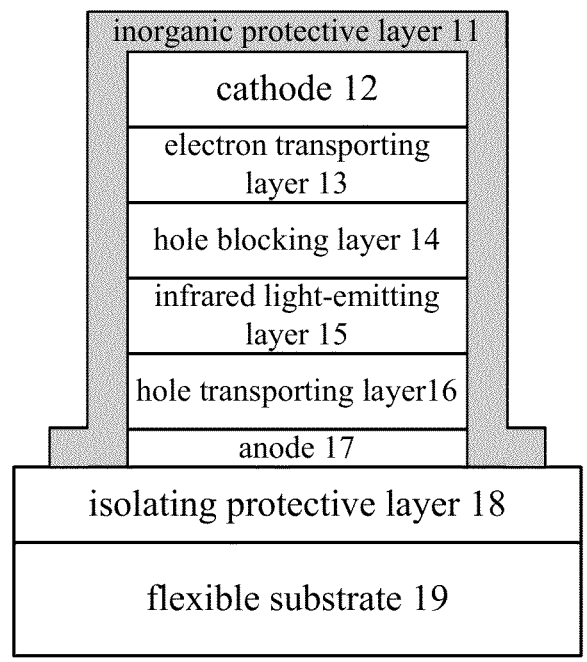
FIG. 2 is a schematic structure of a mid-infrared OLED unit according to the first embodiment of the present invention.

Referring to FIG. 2, the infrared OLED unit 1 according to the present invention from top to bottom in sequence consists of: an inorganic protective layer 11, a cathode 12, an electron transporting layer 13, a hole blocking layer 14, an infrared light-emitting layer 15, a hole transporting layer 16, an anode 17, an isolating protective layer 18, and a flexible substrate 19. The inorganic protective layer 11 is covered on the cathode 12, the electron transporting layer 13, the hole blocking layer 14, the infrared light-emitting layer 15, the hole transporting layer 16, and the anode 17, which is connected with the isolating protective layer 18. Wherein, the isolating protective layer 11 is selected from the materials consisting of TiO$_2$, SiO$_2$, Al$_2$O$_3$, SiN$_x$, SiO$_x$N$_y$, SiO$_x$C$_y$, or diamond-like carbon (DLC) film; the material of the cathode 12 is Al or Ag; the material of the electron transporting layer 13 is 8-tris-hydroxyquinoline aluminum (Alq3); the material of the hole blocking layer is 1,3,5-Tris(1-phenyl-1H-benzimidazol-2-yl) benzene (TPBI) or 2,9-Dimethy-4,7-diphenyl-1,10-phenanthroline (BCP); the material of the infrared light-emitting layer 15 is copper phthalocyanine (emission peak at 1120 nm) or tris(8-hydroxyquinolinato) erbium (emission peak at 1530 nm); the material of the hole transporting layer 16 is N,N'-bis (3-methylphenyl)-N,N'-Diphenyl-1,1'-biphenyl 4,4'-diamine (TPD) or N,N'-bis(1-naphthyl)-N,N'-diphenyl-1,1'-biphenyl-4,4'-diamine (NPD); and the material of the anode 17 is indium tin oxide (ITO).

Figure 3:
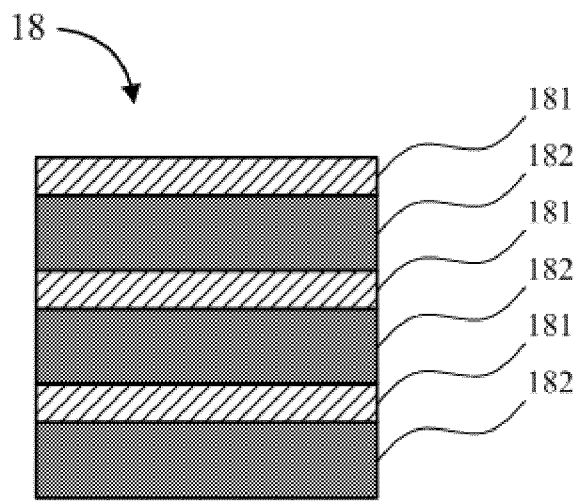
FIG. 3 is a schematic structure of the protective layer of the mid-infrared OLED unit according to the first embodiment of the present invention.

The present invention utilizes flexible substrate. In order to prevent external moisture and oxygen penetrating into the internal infrared OLED unit 1, it further provides the isolating protective layer (Barix) 18. The presence of the isolating protective layer 18 eliminates the need of mechanical packaging component to block water vapor and oxygen. The isolating protective layer 18 is an alternating structure with an inorganic dielectric dense layer 181 and a polymer layer 182, as shown in FIG. 3. The inorganic dielectric dense layer 181 is mainly used to block water vapor and oxygen. The polymer layer 182 is mainly used to increase the adhesion and the absorbed stress between the inorganic dielectric dense layers 181 and increases the surface planarization.

The inorganic dielectric dense layer 181 is selected from the materials consisting of: transparent oxide film, such as TiO$_2$, MgO, SiO$_2$, ZrO$_2$, ZnO, or Al$_2$O$_3$; the transparent fluoride film, such as LiF or MgF$_2$; the Si$_x$N$_y$ consists of Si$_3$N$_4$, TiN, or SiN$_x$; the chalcogenide glass, such as Se, Te, or Sb; or other materials, such as ZnS, SiO$_x$N$_y$, or SiO$_x$C$_y$.

The polymer layer 182 is selected from the materials consisting of: parylene-based material, such as poly-p-xylylene (PPX) or poly-2-chloro-p-xylene (PCPX); polyolefin-based material, such as polyethylene (PE), polystyrene (PS), polypropylene (PP), poly ethylene terephthalate (PET), poly-tetrafluoroethene (PTFE), or polyfluoroalkoxy (PFA); polyester-based material, such as polyethylene naphthalate (PEN), polycarbonate (PC), polyethylene methyl methacrylate (PMMA), polyvinyl acetate (PVAC), or polyethersulfone (PES); or polyimide.

The flexible substrate 19 according to the present embodiment is plastic substrate, film substrate, thin glass substrate, or stainless steel foil substrate.

The solar cell 2 according to the present embodiment is organic solar cell or low temperature process inorganic solar cell. The organic solar cell is polymer with heterogeneous p-n junction structure; wherein the organic heterogeneous p-n junction material is poly(3-hexylthiophene) (P3HT): [6,6]-phenyl C61-butyric acid methyl ester (PCBM) mixture, poly (2-methoxy-5-(2'-ethyl-hexyloxy)-1,4-phenylene vinylene) (MEH-PPV): [6,6]-phenyl C61-butyric acid methyl ester (PCBM) mixture, or poly[2-methoxy-5-(3',7'-Dimethyloctyloxy)-1,4-phenylenevinylene] (MDMO-PPV): [6,6]-phenyl C61-butyric acid methyl ester (PCBM) mixture. The inorganic solar cell is amorphous silicon solar cell, polycrystalline silicon solar cell, or inorganic compound semiconductor thin film solar cell.

In the infrared OLED display device according to the first embodiment of the present invention, the infrared OLED unit 1 can also use hard screen glass substrate. In this case, the infrared OLED unit 1 from top to bottom in sequence consists of: a cathode 12, an electron transporting layer 13, a hole blocking layer 14, an infrared light-emitting layer 15, a hole transporting layer 16, an anode 17, and a hard screen substrate. The selection of the material of each layer is consistent with above and not repeat here.

Figure 4:
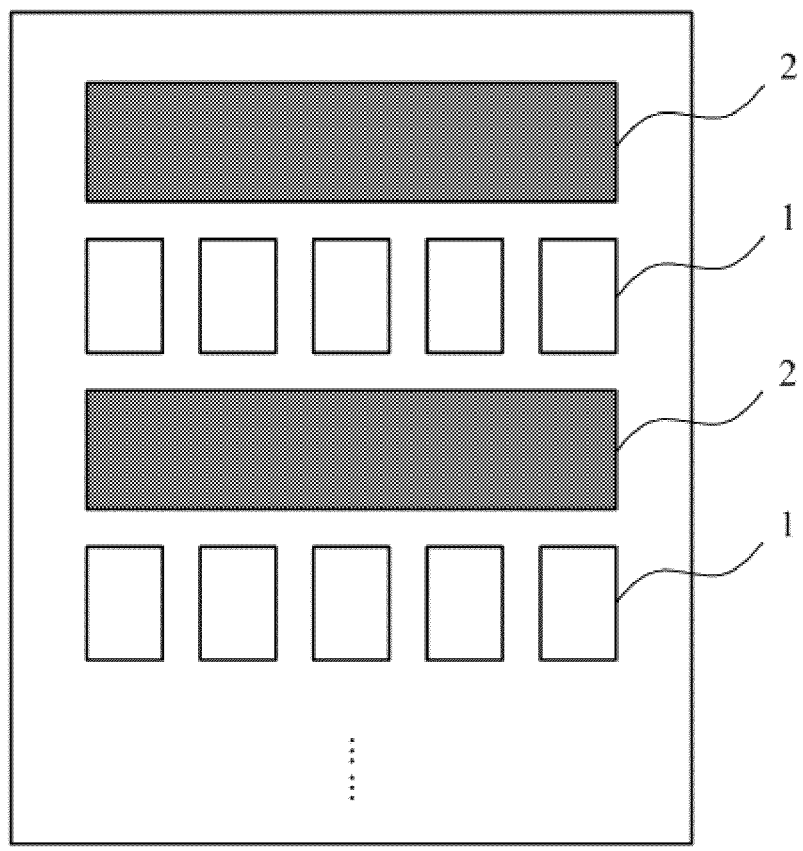
FIG. 4 is a schematic structure of the pixel of the infrared OLED display device according to the first embodiment of the present invention.
Figure 5:
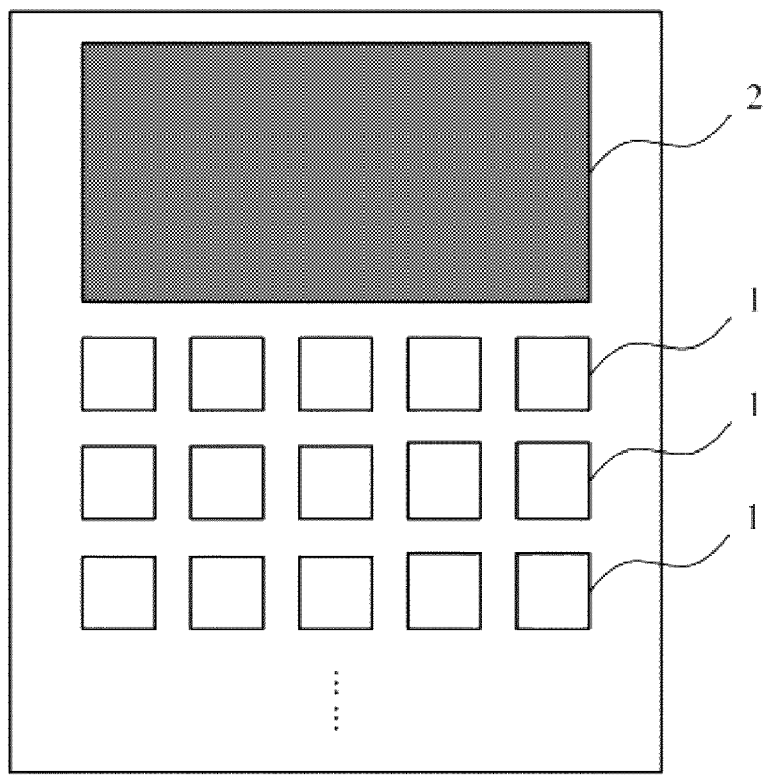
FIG. 5 is a schematic structure of another pixel of the infrared OLED display device according to the first embodiment of the present invention.

Referring to FIG. 4 and FIG. 5, they show schematic structures of the two pixels of the infrared OLED display device according to the first embodiment of the present invention. In FIG. 4, the solar cell PV 2 and the infrared OLED unit 1 are parallel alternating structure. PV 2 is continuous strip-like. Multiple infrared OLED units 1 are banded arrangement with interval. With this structure, the infrared OLED units 1 are widely distributed, so that the displaying area is larger. However, the wider distribution of the infrared OLED units 1 increases the power requirements and makes the arrangement of the control circuit inconvenient. In FIG. 5, the PV 2 and the infrared OLED unit 1 are independent regions. PV 2 is a continuous structure, which equals to a pixel. The infrared OLED units 1 are concentrated. With this structure, the display shows good effect, and the power supply and control are more convenient. However, the display area is small. In the embodiment, choose the pixel structure shown in FIG. 4 or FIG. 5 according to the requirements of the specific application.

Figure 6:
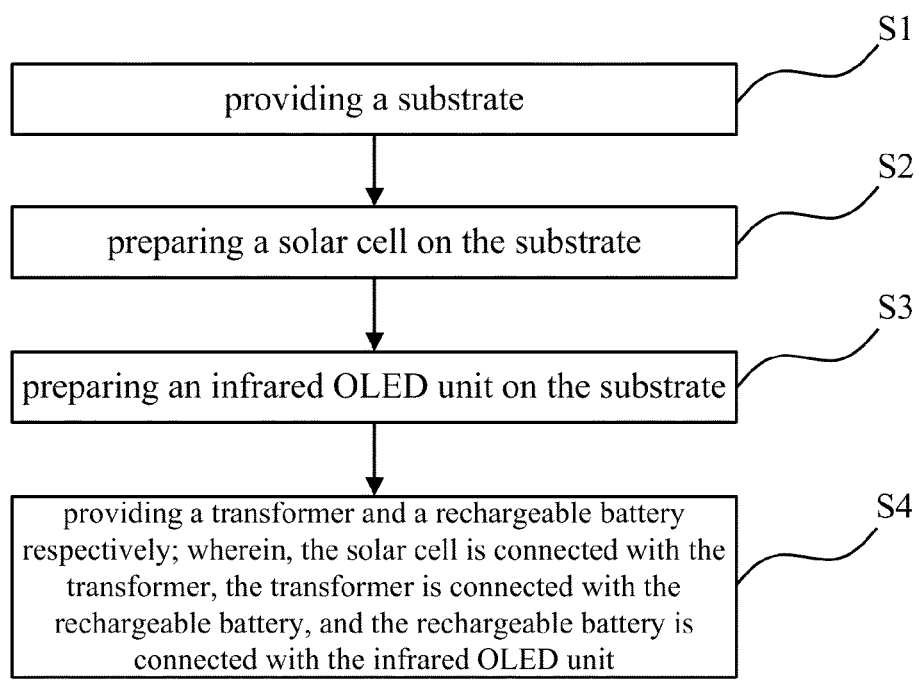
FIG. 6 is a flow diagram of the manufacturing method of the infrared OLED display device according to the second embodiment of the present invention.

The second embodiment of the present invention provides a manufacturing method of infrared OLED display device, as shown in FIG. 6, comprising: providing a substrate; preparing a solar cell on the substrate; preparing an infrared OLED unit on the substrate; and providing a transformer and a rechargeable battery respectively; wherein, the solar cell is connected with the transformer, the transformer is connected with the rechargeable battery, and the rechargeable battery is connected with the infrared OLED unit.

The solar cell is organic solar cell or inorganic solar cell; wherein the inorganic solar cell is amorphous silicon solar cell, polycrystalline silicon solar cell, or inorganic compound semiconductor thin film solar cells. Therefore, when the solar cell is prepared on the substrate, the manufacturing method will be different according to various solar cells, which are as follows:

(1) If the organic solar cell is used, in the present embodiment, the organic solar cell is polymer with heterogeneous p-n junction structure; wherein the organic heterogeneous p-n junction material is poly(3-hexylthiophene) (P3HT): [6,6]-phenyl C61-butyric acid methyl ester (PCBM) mixture, poly (2-methoxy-5-(2'-ethyl-hexyloxy)-1,4-phenylene vinylene) (MEH-PPV): [6,6]-phenyl C61-butyric acid methyl ester (PCBM) mixture, or poly[2-methoxy-5-(3',7'-Dimethyloctyloxy)-1,4-phenylenevinylene] (MDMO-PPV): [6,6]-phenyl C61-butyric acid methyl ester (PCBM) mixture. When preparing, dissolve the organic mixture in an organic solvent such as chlorobenzene, and then spraying on a specific position of the substrate using printing technology.

(2) If the inorganic solar cell is used, the process temperature of the inorganic solar cell is high, the organic materials of the infrared OLED unit can not afford, so that the inorganic solar cell is prepared prior to the infrared OLED unit on the substrate. In the inorganic solar cell, the amorphous silicon solar cell and inorganic compound semiconductor thin film solar cell are prepared using currently mature production process. However, the preparation of the polycrystalline silicon solar cell is different from the currently production process of the marketed products, which is using amorphous silicon production process. It just needs to proceed with thermal annealing or laser annealing after coating, and then grow polycrystalline silicon from amorphous silicon.

The infrared OLED unit is prepared using currently mature OLED unit fabrication process. When the substrate is a flexible substrate, and the infrared OLED unit according to the present invention comprises the isolating protective layer 18 (as shown in FIG. 3), the preparation of isolating protective layer 18 is: sputtering the polymer material on the substrate, curing by UV irradiation, and then sputtering a layer of inorganic dielectric material, which forms the alternating structure with an inorganic dielectric dense layer 181 and a polymer layer 182.

The polymer layer is selected from the materials consisting of: parylene-based material, such as poly-p-xylylene (PPX) or poly-2-chloro-p-xylene (PCPX); polyolefin-based material, such as polyethylene (PE), polystyrene (PS), polypropylene (PP), poly ethylene terephthalate (PET), polytetrafluoroethene (PTFE), or polyfluoroalkoxy (PFA); polyester-based material, such as polyethylene naphthalate (PEN), polycarbonate (PC), polyethylene methyl methacrylate (PMMA), polyvinyl acetate (PVAC), or polyethersulfone (PES); or polyimide.

The inorganic dielectric dense layer is selected from the materials consisting of: transparent oxide film, such as $TiO_2$, MgO, $SiO_2$, $ZrO_2$, ZnO, or $Al_2O_3$; the transparent fluoride film, such as LiF or $MgF_2$; the $Si_xN_y$ consists of $Si_3N_4$, TiN, or $SiN_x$; the chalcogenide glass, such as Se, Te, or Sb; or other materials, such as ZnS, $SiO_xN_y$, or $SiO_xC_y$.

It should be noted that the structure and materials of the solar cell and the infrared OLED unit according to the present embodiment and the beneficial effects thereof are the same as the first embodiment. To describe simple, the present embodiment is not repeated here.

The solar cell and the infrared OLED unit according to the present invention are integrated into one device, so that the infrared OLED display device not only display infrared image, but also charge itself using the solar cell, which saves energy.

The disclosed embodiments are the preferred embodiments of the present invention, but not intending to impose any unduly constraint to the appended claims. Any equivalent change is considered encompassed in the scope of protection defined by the claims of the present invention.

What is claimed is:

1. An infrared OLED display device, comprising:
   multiple infrared OLED units, which are used to display infrared image;
   a solar cell, which is used to absorb sunlight and then convert it to electrical energy;
   a transformer, which is used to transform the voltage of the electrical energy generated from the solar cell to the voltage of power for the infrared OLED units; and
   a rechargeable battery, which is used to store the electrical energy after the transformer converts the voltage and to provide the power for the infrared OLED units;
   wherein, the solar cell is connected with the transformer, the transformer is connected with the rechargeable battery, and the rechargeable battery is connected with the multiple infrared OLED units;
   wherein, the solar cell and the infrared OLED unit are provided at independent regions and on the same plane; the solar cell is a continuous structure, which equals to a pixel; and the infrared OLED units are concentrated.

2. The infrared OLED display device as claimed in claim 1, wherein the infrared OLED unit from top to bottom in sequence consists of: an inorganic protective layer, a cathode, an electron transporting layer, a hole blocking layer, an infrared light-emitting layer, a hole transporting layer, an anode, an isolating protective layer, and a flexible substrate.

3. The infrared OLED display device as claimed in claim 2, wherein the inorganic protective layer is covered on the cathode, the electron transporting layer, the hole blocking layer, the infrared light-emitting layer, the hole transporting layer, and the anode, which is in contact with the isolating protective layer.

4. The infrared OLED display device as claimed in claim 2, wherein the isolating protective layer is an alternating structure with an inorganic dielectric layer and a polymer layer.

5. The infrared OLED display device as claimed in claim 4, wherein the inorganic dielectric dense layer is selected from the materials consisting of transparent oxide film, transparent fluoride film, $Si_xN_y$, chalcogenide glass, ZnS, $SiO_xN_y$, or $SiO_xC_y$.

6. The infrared OLED display device as claimed in claim 5, wherein the transparent oxide film consists of $TiO_2$, MgO, $SiO_2$, $ZrO_2$, ZnO, or $Al_2O_3$; the transparent fluoride film consists of LiF or $MgF_2$; the $Si_xN_y$ consists of $Si_3N_4$, or $SiN_x$; the chalcogenide glass consists of Se, Te, or Sb.

7. The infrared OLED display device as claimed in claim 4, wherein the polymer layer is selected from the materials consisting of parylene-based material, polyolefin-based material, polyester-based material, or polyimide.

8. The infrared OLED display device as claimed in claim 7, wherein the parylene-based material consists of poly-p-xylylene (PPX) or poly-2-chloro-p-xylene (PCPX); the polyolefin-based material consists of polyethylene (PE), polystyrene (PS), polypropylene (PP), poly ethylene terephthalate (PET), polytetrafluoroethene (PTFE), or polyfluoroalkoxy (PFA); the polyester-based material consists of polyethylene naphthalate (PEN), polycarbonate (PC), polyethylene methyl methacrylate (PMMA), polyvinyl acetate (PVAC), or polyethersulfone (PES).

9. The infrared OLED display device as claimed in claim 2, wherein the inorganic protective layer is selected from the materials consisting of $TiO_2$, $SiO_2$, $Al_2O_3$, SiNx, $SiO_xN_y$, $SiO_xC_y$, or diamond-like carbon (DLC) film; the material of the cathode is Al or Ag; the material of the electron transporting layer is 8-tris-hydroxyquinoline aluminum (Alq3); the material of the hole blocking layer is 1,3,5-Tris(1-phenyl-1H-benzimidazol-2-yl)benzene (TPBI) or 2,9-Dimethy-4,7- diphenyl-1,10-phenanthroline (BCP); the material of the infrared light-emitting layer is copper phthalocyanine or tris (8-hydroxyquinolinato) erbium; the material of the hole transporting layer is N,N'-bis(3-methylphenyl)-N,N'-Diphenyl-1, 1'-biphenyl 4,4'-diamine (TPD) or N,N'-bis(1-naphthyl)-N,N'-diphenyl-1,1'-biphenyl-4,4'-diamine (NPD); and the material of the anode is indium tin oxide (ITO).

10. The infrared OLED display device as claimed in claim 2, wherein the flexible substrate is plastic substrate, a substrate made of at least one film layer, thin glass substrate with thickness less than 700 microns, or stainless steel foil substrate.

11. The infrared OLED display device as claimed in claim 1, wherein the solar cell is organic solar cell or inorganic solar cell; the organic solar cell is polymer with heterogeneous p-n junction structure; wherein the organic heterogeneous p-n junction material is poly (3-hexylthiophene) (P3HT): [6,6]-phenyl C61-butyric acid methyl ester (PCBM) mixture, poly (2-methoxy-5-(2'-ethyl-hexyloxy)-1,4-phenylene vinylene) (MEH-PPV): [6,6]-phenyl C61-butyric acid methyl ester (PCBM) mixture, or poly[2-methoxy-5-(3',7'-Dimethyloctyloxy)-1,4-phenylenevinylene] (MDMO-PPV): [6,6]-phenyl C61-butyric acid methyl ester (PCBM) mixture; the inorganic solar cell is amorphous silicon solar cell, polycrystalline silicon solar cell, or inorganic compound semiconductor thin film solar cell.

12. A manufacturing method of infrared OLED display device, comprising:
providing a substrate;
preparing a solar cell on the substrate;
preparing an infrared OLED unit on the substrate; and
providing a transformer and a rechargeable battery respectively;
wherein, the solar cell is connected with the transformer, the transformer is connected with the rechargeable battery, and the rechargeable battery is connected with the infrared OLED unit;
wherein, the solar cell and the infrared OLED unit are provided at independent regions and on the same plane; the solar cell is a continuous structure, which equals to a pixel; and the infrared OLED units are concentrated.

13. The manufacturing method as claimed in claim 12, wherein the infrared OLED unit from top to bottom in sequence consists of: an inorganic protective layer, a cathode, an electron transporting layer, a hole blocking layer, an infrared light-emitting layer, a hole transporting layer, an anode, an isolating protective layer, and a flexible substrate; the manufacturing method of the isolating protective layer is: sputtering a polymer material on the substrate, curing by UV irradiation, and then sputtering a layer of inorganic dielectric material, which forms an alternating structure with an inorganic dielectric dense layer and a polymer layer.

14. The manufacturing method as claimed in claim 13, wherein the polymer material is selected from the materials consisting of parylene-based material, polyolefin-based material, polyester-based material, or polyimide.

15. The manufacturing method as claimed in claim 14, wherein the parylene-based material consists of poly-p-xylylene (PPX) or poly-2-chloro-p-xylene (PCPX); the polyolefin-based material consists of polyethylene (PE), polystyrene (PS), polypropylene (PP), poly ethylene terephthalate (PET), polytetrafluoroethene (PTFE), or polyfluoroalkoxy (PFA); the polyester-based material consists of polyethylene naphthalate (PEN), polycarbonate (PC), polyethylene methyl methacrylate (PMMA), polyvinyl acetate (PVAC), or polyethersulfone (PES).

16. The manufacturing method as claimed in claim 12, wherein the solar cell is organic solar cell or inorganic solar cell; wherein the inorganic solar cell is amorphous silicon solar cell, polycrystalline silicon solar cell, or inorganic compound semiconductor thin film solar cells; the inorganic solar cell is prepared prior to the infrared OLED unit on the substrate.

17. The manufacturing method as claimed in claim 16, wherein the organic solar cell is polymer with heterogeneous p-n junction structure; wherein the organic heterogeneous p-n junction material is poly(3-hexylthiophene) (P3HT): [6,6]-phenyl C61-butyric acid methyl ester (PCBM) mixture, poly (2-methoxy-5-(2'-ethyl-hexyloxy)-1,4-phenylene vinylene) (MEH-PPV): [6,6]-phenyl C61-butyric acid methyl ester (PCBM) mixture, or poly[2-methoxy-5-(3',7'-Dimethyloctyloxy)-1,4-phenylenevinylene] (MDMO-PPV): [6,6]-phenyl C61-butyric acid methyl ester (PCBM) mixture; the step of preparing the organic solar cell on the substrate specifically is: dissolving the organic mixture in an organic solvent such as chlorobenzene, and then spraying on a specific position of the substrate using printing technology.

18. The manufacturing method as claimed in claim 16, wherein the step of preparing the polycrystalline silicon solar cell on the substrate specifically is: using amorphous silicon production process, proceeding with thermal annealing or laser annealing after coating, and growing polycrystalline silicon from amorphous silicon.

19. An infrared OLED display device, comprising:
multiple infrared OLED units, which are used to display infrared image, the infrared OLED unit from top to bottom in sequence consisting of: an inorganic protective layer, a cathode, an electron transporting layer, a hole blocking layer, an infrared light-emitting layer, a hole transporting layer, an anode, an isolating protective layer, and a flexible substrate;
a solar cell, which is used to absorb sunlight and then convert it to electrical energy;
a transformer, which is used to transform the voltage of the electrical energy generated from the solar cell to the voltage of power for the infrared OLED units; and
a rechargeable battery, which is used to store the electrical energy after the transformer converts the voltage and to provide the power for the infrared OLED units;
wherein, the solar cell is connected with the transformer, the transformer is connected with the rechargeable battery, and the rechargeable battery is connected with the multiple infrared OLED units;
wherein, the solar cell and the infrared OLED unit are provided at independent regions and on the same plane; the solar cell is a continuous structure, which equals to a pixel; and the infrared OLED units are concentrated.

* * * * *